United States Patent [19]

Nishimichi et al.

[11] Patent Number: 4,709,173
[45] Date of Patent: Nov. 24, 1987

[54] INTEGRATED CIRCUIT HAVING LATCH CIRCUIT WITH MULTIPLEXER SELECTION FUNCTION

[75] Inventors: Yoshito Nishimichi, Moriguchi; Masaru Uya, Hirakata; Katsuyuki Kaneko, Osaka, all of Japan

[73] Assignee: Matsushita Electric Industrial Co., Ltd., Kadoma, Japan

[21] Appl. No.: 864,466

[22] Filed: May 19, 1986

[30] Foreign Application Priority Data

May 17, 1986 [JP] Japan .................. 60-105041

[51] Int. Cl.$^4$ ............... H03K 3/356; H03K 19/094
[52] U.S. Cl. .................... 307/243; 307/279; 307/443; 307/473; 307/585
[58] Field of Search ............ 307/443, 473, 243, 279, 307/270, 200 B, 448, 579, 585, 291

[56] References Cited

U.S. PATENT DOCUMENTS

| | | | |
|---|---|---|---|
| 3,457,435 | 7/1969 | Burns et al. | 307/304 X |
| 3,812,384 | 5/1974 | Skorup | 307/272 A X |
| 3,993,916 | 11/1976 | Copeland, III et al. | 377/79 |
| 4,063,225 | 12/1977 | Stewart | 307/279 X |
| 4,164,666 | 8/1979 | Hirasawa | 307/583 X |
| 4,329,600 | 5/1982 | Stewart | 307/270 X |
| 4,446,390 | 5/1984 | Alaspa | 307/585 X |
| 4,571,509 | 2/1986 | Tobita | 307/473 X |
| 4,608,504 | 8/1986 | Yamamoto | 307/473 X |

FOREIGN PATENT DOCUMENTS

| | | | |
|---|---|---|---|
| 193125 | 11/1982 | Japan | 307/473 |
| 77328 | 5/1983 | Japan | 307/473 |
| 41325 | 3/1985 | Japan | 307/473 |
| 169219 | 9/1985 | Japan | 307/473 |
| 236322 | 11/1985 | Japan | 307/451 |

OTHER PUBLICATIONS

"Polarity Hold Latch with Tristate Output"; IBM-TDB; vol. 27, No. 11, pp. 6562-6563, 4/1985.

Primary Examiner—Stanley D. Miller
Assistant Examiner—D. R. Hudspeth
Attorney, Agent, or Firm—Wenderoth, Lind & Ponack

[57] ABSTRACT

An integrated circuit having a latch circuit with a selection function includes a selection circuit having a plurality of logic circuits each capable of presenting three output states depending on a selection signal supplied thereto, a latch circuit having a bistable circuit composed of first and second logic inverting circuits, and a connection system for supplying an output of the selection circuit to an input of the latch circuit. An output resistance of the second logic inverting circuit is set to be at least ten times as high as an output resistance of any one of the logic circuits which make up the selection circuit.

1 Claim, 7 Drawing Figures

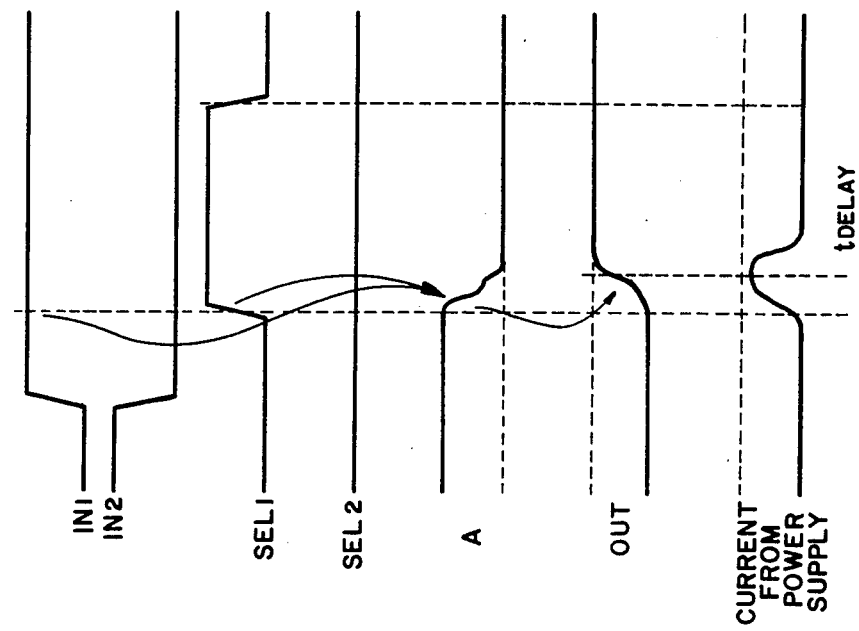
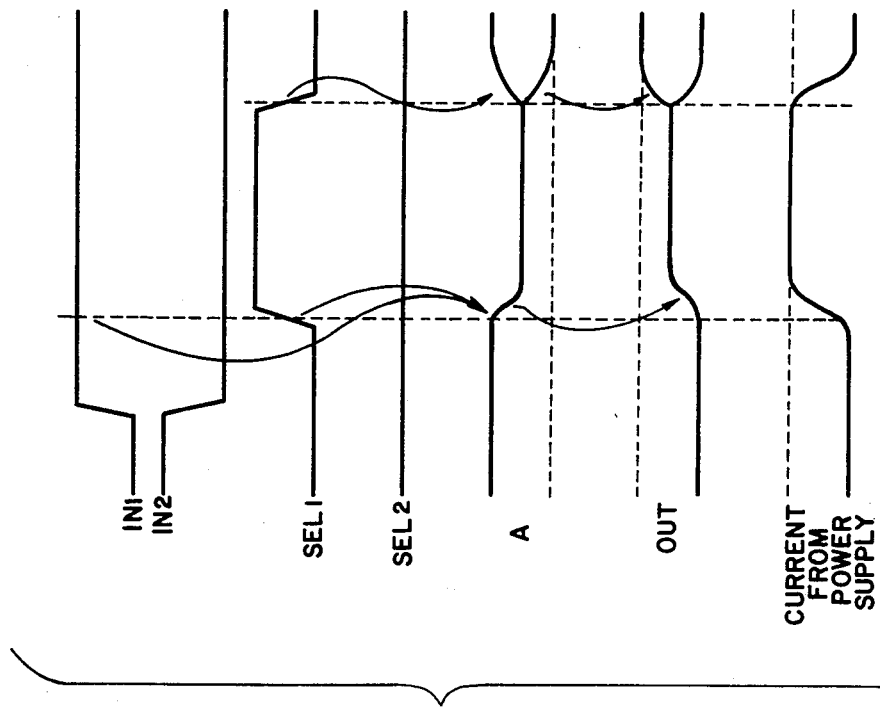

4,709,173

INTEGRATED CIRCUIT HAVING LATCH CIRCUIT WITH MULTIPLEXER SELECTION FUNCTION

BACKGROUND OF THE INVENTION

This invention relates to an integrated circuit having a latch circuit with a selection function for selecting plural input signals by a control signal, and taking them in and holding statically.

There is the direction toward higher integration as one of the technical trends of integrated circuits today, and it is attempted, in this direction, to curtail the design rules and simplify the circuit configuration. In particular, the latter means is executed in various circuits.

For instance, when setting up static parallel registers in a logic integrated circuit, conventionally, ordinary D-type latches were used to cause the individual data inputs to correspond to individual parallel data inputs, and the individual data outputs to correspond to individual parallel data outputs, and an enable signal as for parallel registers was obtained by commonly connecting the individual enable signal inputs. However, as the number of bits of parallel processing increased, it was necessary to reduce the area of the D-type latches to be used. To satisfy this demand, the inverter used to generate an inverted enable signal in the D-type latch is removed, and an inverted enable signal is supplied from outside, thereby reducing the area of the D-type latch. What is added to the hardware due to the application of the inverted enable signal is, in the minimum case, only one inverter and one wire serving as the trunk line.

On the other hand, some of the general-purpose TTL-ICs contain a circuit to select and latch plural signals by combining a selector and latch. In this circuit, too, an attempt has been made to simplify in order to improve the degree of integration, but since the circuit configuration is originally simple, it seems difficult to further improve the degree of integration.

SUMMARY OF THE INVENTION

A primary object of this invention is to improve the degree of integration of an IC by further simplifying the circuit configuration of a latch circuit having a selection function.

Another object of this invention is to raise the operating speed of the IC by further simplifying the circuit configuration of the latch circuit having a selection function.

These and other objects are accomplished by an integrated circuit having a latch circuit with a selection function, which comprises a selection circuit having a plurality of logic circuits capable of presenting three output states depending on a selection signal, a latch circuit having a bistable circuit composed of first and second logic circuits, a means for setting an output resistance of the second logic inverting circuit sufficiently large with respect to an output resistance of any one of said plurality of logic circuits, and a connection system to apply the output of said selection circuit to the input of said latch circuit.

In specific embodiments, a tristate inverter is used as the logic circuit. A series connection of a transfer gate composed of one conductive type MOS transistor connected to the inverter may also be used as the logic circuit. Furthermore, a series connection of transfer gate composed of an N-channel MOS transistor and a P-channel MOS transistor connected to the inverter may also be used as the logic circuit. With respect to the output resistance of the logic circuit, the output resistance of the second logic inverting circuit is set to be at least 10 times as high. The output of the second logic inverting circuit corresponds to the output of the logic circuit.

According to the present invention as described herein, the following benefits, among others, are obtained.

(1) The circuit configuration of the latch circuit having a selection function may be further simplified, and the degree of integration of the IC incorporating this latch circuit may be further improved.

(2) By simplification of the circuit configuration of the latch circuit with a selection function, the operation of the IC incorporating this latch function may be heightend in speed.

BRIEF DESCRIPTION OF THE DRAWINGS

While the novel features of the invention are set forth with particularly in the appended claims, the invention, both as to organization and content, will be better understood and appreciated, along with other objects and features thereof, from the following detailed description taken in conjunction with the drawings, in which:

FIGS. 3(a)–3(c) are waveform diagrams for determining the operating conditions of the latch circuit of FIG. 1.

DETAILED DESCRIPTION OF THE INVENTION

Figure 1:
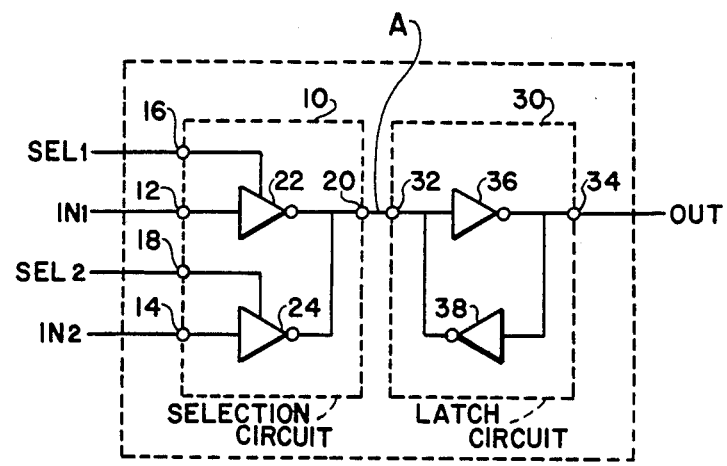
FIG. 1 is a circuit diagram of a latch circuit with a selection function in an integrated circuit which is one of the embodiments in accordance with the present invention.

One of the embodiments of this invention is shown in FIG. 1, in which a selection circuit 10 possesses input terminals 12 and 14, selection signal application terminals 16 and 18 and an output terminal 20, and in which tristate inverters 22 and 24 are connected between said input terminals 12 and 14 and output terminal 20 as logic circuits capable of presenting three different states (high level, low level and high-impedance). On the other hand, a latch circuit 30 possesses an input terminal 32 and an output terminal 34, and the input terminal 32 is connected to the input of an inverter 36 and the output of an inverter 38, while the output terminal 34 is connected to the output of the inverter 36 and input of the inverter 38. In addition, the output terminal 20 of the selection circuit 10 is connected to the input terminal 32 of the latch circuit 30.

Figure 2:
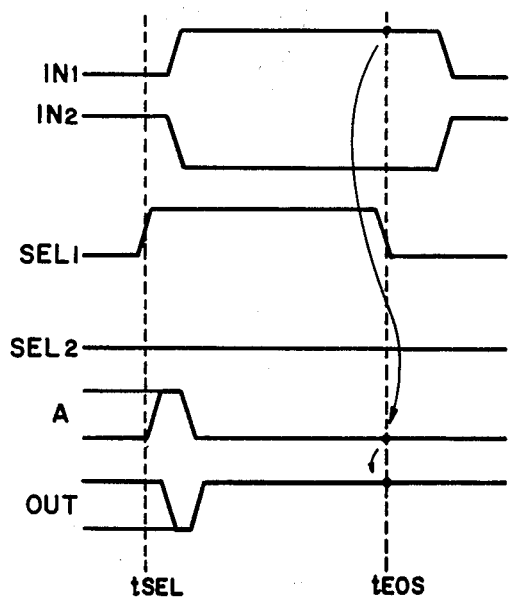
FIG. 2 is a diagram used to explain the operation of the latch circuit of FIG. 1.

The operation of this invention is described below while referring to FIG. 2, in which SEL1 and SEL2 are the selection signals supplied to the selection signal application terminals 16 and 18 of the selection circuit 10, respectively, and IN1 and IN2 are input signals supplied to the input terminals 12 and 14 of the selection circuit 10, respectively, and OUT is an output signal appearing at the output terminal 34 of the latch circuit. A is a signal appearing at the connection between the output terminal 20 of selection circuit 10 and the input terminal 32 of latch circuit 30.

Let us consider, for example, using selection signal SEL1, a case of selecting and latching the input signal IN1. Time $t_{SEL}$ is the starting time of the selection action, and time $t_{EOS}$ is the ending time of the selection action. Since the selection signal SEL1 is at high level between time $t_{SEL}$ and time $t_{EOS}$, the tristate inverter 22 operates in the same fashion as an ordinary inverter to deliver an inverted version of input signal IN1. To the contrary, since the selection signal SEL2 is at low level between time $t_{SEL}$ and time $t_{EOS}$, the output of the tristate inverter 24 is a high impedance regardless of the value of input signal IN2. As a result, at the output 20 of the selection circuit 10, signal A is a low level, which becomes an input signal to the latch circuit 30. In succession, the latch circuit 30 turns the output signal OUT at the output terminal 34 to a high level, and latches the signal A at the same time.

However, the above function is not obtained if the selection circuit 10 and latch circuit 30 are merely connected together, and what is important is the relationship between the tristate inverters 22 and 24 and the inverter 38. That is, the key is to set the output resistance of the inverter 38 to be at least ten times as high as the output resistance of the tristate inverters 22 and 24. By thus setting, the output resistance, when the output signal OUT is at a low level, the potential of signal A is sufficiently lower than the circuit threshold voltage $V_{THC}$ of the inverter 36, and when the output signal OUT is at a high level, the potential of signal A is sufficiently higher than $V_{THC}$.

This point is more clearly explained by referring to FIGS. 3(a)-3(b), which show waveforms of various parts. Here, let us consider a case of selecting and latching input signal IN1 by using selection signal SEL1, assuming that the initial state of output signal OUT is at a low level. It is also supposed that the circuit threshold voltages $V_{THC}$ of tristate inverters 22 and 24 and inverters 36 and 38 are all set at ½ of a supply voltage $V_{DD}$.

FIG. 3(a) refers to a case in which the output resistance of inverter 38 is equal to that of tristate inverter 22. Signal A is pulled down toward a low level by signal SEL1 and signal IN1, but it reaches only ½ of $V_{DD}$ because of the above output resistance relationship. Therefore, the inverter 36 does not come up to the point of its inverting action, and only delivers ½ of $V_{DD}$ as output signal OUT. When selection signal SEL1 becomes a low level and the selection action is over, the output signal OUT becomes a low level or high level regardless of the input signal IN1, and the action becomes very unstable. Since, signal A and the output signal OUT maintain an intermediate potential with respect to $V_{DD}$ while the selection signal SEL1 is at a high level, a direct current flows, and the power consumption increases.

In FIG. 3(b), on the other hand, the output resistance of inverter 38 is three times that of tristate inverter 22. Signal A is pulled down toward a low level by signal SEL1 and signal IN1, but it is controlled to be ¾ of $V_{DD}$ because of the relation of output resistances noted above. This value is lower than the circuit threshold voltage $V_{THC}$ of the inverter 36, but at this value, the inverting speed of inverter 36 is slow, and it takes a long time until the output signal OUT becomes a high level. Therefore, the inverting timing of the inverter 38 is delayed, too, and the latching timing of signal A is also late. In this case, the action itself is normal, but since the delay of each signal is significant, it is not suited to high speed operation, and, moreover, since the change of waveform is not rapid, the period of flow of direct current is long, and the power consumption is not decreased.

Figure 3C:
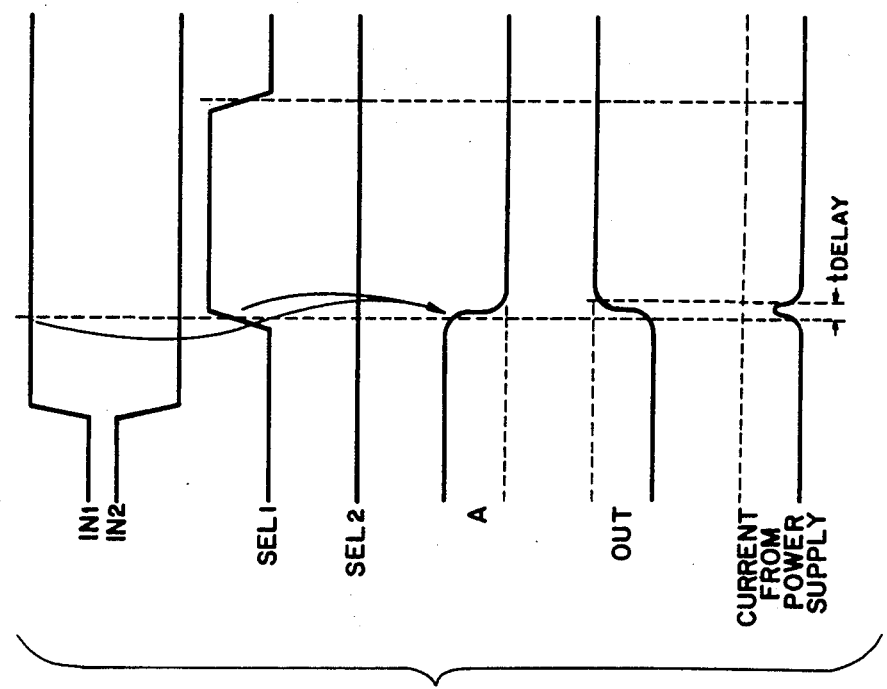

Finally, in FIG. 3(c), the output resistance of inverter 38 is ten times that of tristate inverter 22. Signal A is quickly pulled down to a low level by signal SEL1 and signal IN1. This is because of the above noted relationship of the output resistances. That is, first signal A becomes 1/11 of $V_{DD}$, and since it is sufficiently lower than the circuit threshold voltage $V_{THC}$ of the inverter 36, the inverter 36 inverts quickly, and the output signal OUT becomes a sufficiently high level, and a positive feedback is promptly appllied through the inverter 38, so that signal A becomes a sufficiently low level. Moreover, since the tristate inverter 22 and inverters 36 and 38 invert quickly, the flowing current is only a transient current, and the power consumption is small.

The above examples are briefly summarized below.

TABLE 1

| $R_{OI}/R_{OT}$ | Action | Action speed | Power consumption |
| --- | --- | --- | --- |
| 1 | Unstable | — | Large |
| 3 | Normal | Slow | Slightly large |
| 10 | Normal | Fast | Small |

In Table 1, $R_{OI}/R_{OT}$ is the ratio of the output resistance of inverter 38 to that of tristate inverter 22.

Moreover, according to this invention, by using CMOS circuitry, the above noted embodiment can be made up of 16 transistors. On the other hand, when an ordinary AND-NOR type complex gate is used in the selection circuit and D-latch in the latch circuit, 20 transistors are required, which proves that the present invention is suited to improvement of degree of integration. Furthermore, in this embodiment, when the inverter used to invert the selection signal in the tristate inverters 22 and 24 is removed, and the inverted selection signal is applied from the outside, only 12 transistors are needed to set up the same composition.

In this embodiment, two input signals (signals to be selected) are used, but by increasing the number of tristate inverters 22 and 24, more than one arbitrary input signal can be selected and latched. Yet, the circuit of this embodiment may be composed of various transistors in a range not surpassing the concept of this invention. For example, it may be easily composed of CMOS transistors or N-channel MOS transistors.

Figure 4A:
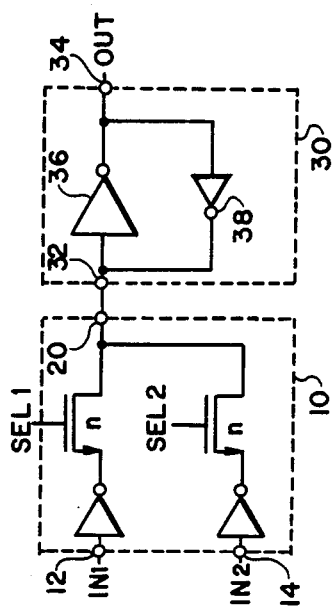
FIG. 4(a)–4(b) are circuit diagrams of different embodiments of a latch circuit in accordance with the present invention.
Figure 4B:
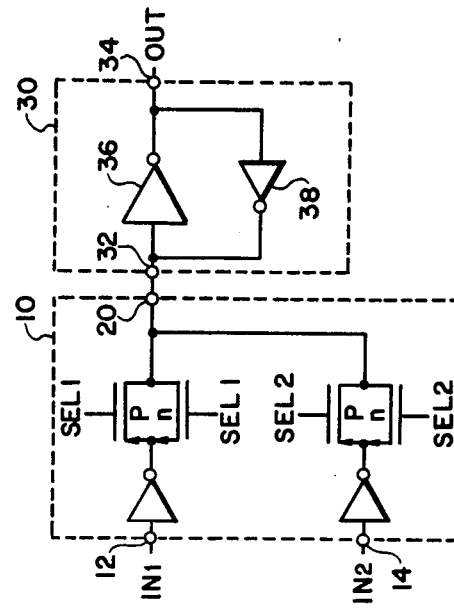

Incidentally, an example of using transfer gates composed of N-channel MOS transistors connected to the inverter as the selection circuit 10 is shown in FIG. 4(a), and an example of using transfer gates composed of N-channel MOS transistors and P-channel MOS transistors connected to the inverter as the selection circuit 10 is shown in FIG. 4(b).

As described so far, according to this invention, a circuit for selecting and latching plural signals by combining selector and latch can be composed of few circuit elements, which contributes greatly to higher integration of the integrated circuit.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What we claim is:

1. An integrated circuit comprising:

a selection circuit having at least first and second input terminals to which input signals are applied, at least first and second selection terminals to which selection signals are applied, an output terminal, and at least first and second tri-state inverters, an input, control, and output of each of said tri-state inverters being respectively coupled to one of said input terminals, selection terminals and coupled in common to said output terminal of said selection circuit, each of said tri-state inverters having three output staes consisting of high level, low level, and high impedance states, said high and low level states being obtained when its selection signal is a first state, and said high impedance state being obtained when its selection signal is a second state;

a latch circuit having an input terminal, an output terminal, and first and second inverters, an input of said first inverter being coupled to said input terminal of said latch circuit and an output of said second inverter, an output of said first inverter being coupled to said output terminal of said latch circuit and an input terminal of said second inverter, said first and second inverters forming a bi-stable circuit, an output resistance of said second inverter being set to be at least ten times as high as an output resistance of any one of said tri-state inverters; and a connection means for coupling said output terminal of said selection circuit to said input terminal of said latch circuit, whereby, when said first selection terminal receives a selection signal of said first state, and said second selection terminal receives a selection signal of said second state, an output of said first tri-state inverter is latched by said latch circuit.

* * * * *